US012566369B2

(12) United States Patent
Son et al.

(10) Patent No.: US 12,566,369 B2
(45) Date of Patent: *Mar. 3, 2026

(54) METHOD AND APPARATUS FOR MANUFACTURING A PHOTOMASK FROM A BLANK MASK

(71) Applicant: SK enpulse Co., Ltd., Pyeongtaek-si (KR)

(72) Inventors: Sung Hoon Son, Seoul (KR); GeonGon Lee, Seoul (KR); Suk Young Choi, Seoul (KR); Hyung-joo Lee, Seoul (KR); Suhyeon Kim, Seoul (KR); Seong Yoon Kim, Seoul (KR); Min Gyo Jeong, Seoul (KR); Inkyun Shin, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 400 days.

This patent is subject to a terminal disclaimer.

(21) Appl. No.: 17/980,313

(22) Filed: Nov. 3, 2022

(65) Prior Publication Data

US 2023/0135120 A1     May 4, 2023

(30) Foreign Application Priority Data

Nov. 3, 2021    (KR) ........................ 10-2021-0149474

(51) Int. Cl.
| | |
|---|---|
| *G03F 1/58* | (2012.01) |
| *G03F 1/48* | (2012.01) |
| *G03F 1/60* | (2012.01) |

(52) U.S. Cl.
CPC .................. *G03F 1/58* (2013.01); *G03F 1/48* (2013.01); *G03F 1/60* (2013.01)

(58) Field of Classification Search
None
See application file for complete search history.

(56) References Cited

U.S. PATENT DOCUMENTS

| | | | | |
|---|---|---|---|---|
| 5,700,605 A | * | 12/1997 | Ito ............................. | G03F 1/30 |
| | | | | 430/323 |
| 2001/0044054 A1 | * | 11/2001 | Kaneko ..................... | G03F 1/50 |
| | | | | 428/432 |
| 2007/0020534 A1 | * | 1/2007 | Yoshikawa ............... | G03F 1/54 |
| | | | | 428/428 |
| 2015/0268552 A1 | * | 9/2015 | Nam ......................... | G03F 1/26 |
| | | | | 430/5 |
| 2017/0139316 A1 | * | 5/2017 | Shishido ................... | G03F 1/32 |

(Continued)

FOREIGN PATENT DOCUMENTS

| | | | | | |
|---|---|---|---|---|---|
| JP | 2001305713 A | * | 11/2001 | ............... | G03F 1/46 |
| JP | 2009-294681 A | | 12/2009 | | |

(Continued)

*Primary Examiner* — Martin J Angebranndt
(74) *Attorney, Agent, or Firm* — NSIP Law

(57)     ABSTRACT

A blank mask includes a transparent substrate and a multilayer light shielding film disposed on the transparent substrate, the multilayer light shielding film including a transition metal and at least any one between oxygen and nitrogen, the multilayer light shielding film including a first light shielding film and a second light shielding film disposed on the first light shielding film, and the multilayer light shielding film having an EA (Edge side Area damaged) value of 2 $nm^2$ or less.

11 Claims, 2 Drawing Sheets

200

(56) References Cited

U.S. PATENT DOCUMENTS

| | | | | | |
|---|---|---|---|---|---|
| 2017/0168384 | A1 * | 6/2017 | Shishido | .................. | G03F 1/80 |
| 2023/0135037 | A1 * | 5/2023 | Jeong | ...................... | G03F 1/26 |
| | | | | | 430/5 |
| 2023/0135120 | A1 * | 5/2023 | Son | ........................... | G03F 1/82 |
| | | | | | 430/5 |

FOREIGN PATENT DOCUMENTS

| | | | | | |
|---|---|---|---|---|---|
| JP | 5562835 | B | 7/2014 | | |
| JP | 2016105158 | A * | 6/2016 | .............. | G03F 1/46 |
| JP | 2016188997 | A * | 11/2016 | .............. | G03F 1/08 |
| JP | 2017-151427 | A | 8/2017 | | |
| JP | 2018-49111 | A | 3/2018 | | |
| JP | 2018-194830 | A | 12/2018 | | |
| JP | 2020-74053 | A | 5/2020 | | |
| JP | 2021152574 | A * | 9/2021 | .............. | G03F 1/26 |
| KR | 10-2007-0060529 | A | 6/2007 | | |
| KR | 10-2009-0016210 | A | 2/2009 | | |
| KR | 10-2009-0047320 | A | 5/2009 | | |
| KR | 10-2010-0127864 | A | 12/2010 | | |
| KR | 10-2010-0134074 | A | 12/2010 | | |
| KR | 10-2011-0016739 | A | 2/2011 | | |
| KR | 20130027435 | A * | 3/2013 | .............. | G03F 1/62 |
| KR | 10-2013-0132925 | A | 12/2013 | | |
| KR | 2014027636 | A * | 3/2014 | .............. | G03F 1/38 |
| KR | 10-2014-0050936 | A | 4/2014 | | |
| KR | 10-1471354 | B | 12/2014 | | |
| KR | 10-2016-0105931 | A | 9/2016 | | |
| KR | 20160115739 | A * | 10/2016 | .............. | G03F 1/08 |
| KR | 10-2016-0135374 | A | 11/2016 | | |
| KR | 10-2016-0138247 | A | 12/2016 | | |
| KR | 20180032196 | A * | 3/2018 | .............. | G03F 1/20 |
| KR | 20180076296 | A * | 7/2018 | .............. | G03F 1/26 |
| KR | 10-2020-0066178 | A | 6/2020 | | |
| KR | 10-2020-0137938 | A | 12/2020 | | |
| KR | 2021147391 | A * | 12/2021 | | |
| SG | 10202204506 | | 11/2022 | | |
| TW | 201525608 | A * | 7/2015 | | |

* cited by examiner

100

200

300

METHOD AND APPARATUS FOR MANUFACTURING A PHOTOMASK FROM A BLANK MASK

CROSS-REFERENCE TO RELATED APPLICATIONS

This application claims the benefit under 35 U.S.C. 119(a) of Korean Patent Application No. 10-2021-0149474 filed on Nov. 3, 2021 in the Korean Intellectual Property Office, the entire disclosure of which is incorporated herein by reference for all purposes.

BACKGROUND

1. Field

The following description relates to a method and apparatus for forming one or more layers on a blank mask using a photomask.

2. Description of Related Art

Because there is a high integration of semiconductor devices there is a requirement for increasing the miniaturization of circuit patterns of semiconductor devices. For this reason, the importance of a lithography technique, which is a technique for developing a circuit pattern on a wafer surface using a photomask is being further emphasized.

In the process of manufacturing a miniaturized circuit pattern, a light source for an exposure process, such as in photolithography, requires employing a light source having a short wavelength. One such light source of exposure being recently employed includes an argon fluoride (ArF) excimer laser (having wavelength of 193 nm).

In the related art, different photomasks are provided, including a Binary mask, a Phase shift mask, and the like.

The Binary mask has a structure in which a light shielding layer pattern has been formed on a transparent substrate. In a surface where a pattern has been formed within the Binary mask, a transmissive portion not including a light shielding layer allows exposure light to be transmitted. A light shielding portion including a light shielding layer which blocks exposure to a light source, to thereby transfer a pattern onto a resist film of the surface of a wafer at portions that are exposed to the light source is provided. However, the Binary mask may cause a problem in the development of a minute pattern due to diffraction of light occurring at the edge of the transmissive portion as the pattern becomes more miniatured.

Phase shift masks can include a Levenson type, an Outrigger type, and a Half-tone type. Among the above, the Half-tone type phase shift mask has a structure in which a pattern is formed with semi-transmissive films on a transparent substrate. In a surface where a pattern has been formed within the Half-tone type phase shift mask, a transmissive portion not including a semi-transmissive layer allows the exposure light to be transmitted, and a semi-transmissive portion including a semi-transmissive layer allows an attenuated portion of the exposure light to be transmitted. The attenuated exposure light is allowed to have phase difference compared to the exposure light which was transmitted the transmissive portion. Accordingly, the diffraction light that results at the edge of the transmissive portion is counteracted by the exposure light which has transmitted the semi-transmissive portion. Thus, the phase shift mask can provide a further refined minute pattern on the surface of a wafer.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a blank mask according to one embodiment of the present application includes a transparent substrate and a multilayer light shielding film disposed on the transparent substrate, the multilayer light shielding film includes a transition metal and at least any one between oxygen and nitrogen, the multilayer light shielding film including a first light shielding film and a second light shielding film disposed on the first light shielding film, and the multilayer light shielding film having an EA (Edge side Area damaged) value of 2 nm$^2$ or less according to Equation 1 below;

$$EA = \frac{BC - AC}{2} \qquad \text{[Equation 1]}$$

In the Equation 1, the BC value is a sectional area of the multilayer light shielding film measured before cleaning is performed, the AC value is a sectional area of the multilayer light shielding film measured after the blank mask is soaked in SC-1 (Standard Cleaning-1) solution for 800 seconds and rinsed by ozone water, the SC-1 solution is a solution including $NH_4OH$ of 14.3% by weight, $H_2O_2$ of 14.3% by weight, and $H_2O$ of 71.4% by weight, and the ozone water is a solution including an ozone concentration of 20 ppm (based on the weight) with ultrapure water as a solvent.

The first light shielding film may include a lower light shielding layer and an adhesion enhancing layer disposed on the lower light shielding layer and the adhesion enhancing layer may have a thickness of 1 Å to 15 Å.

A value of subtracting an amount of a transition metal of the adhesion enhancing layer from an amount of a transition metal of the lower light shielding layer may have an absolute value of 10% or less.

A value of subtracting an amount of a transition metal of the adhesion enhancing layer from an amount of a transition metal of the second light shielding film may have an absolute value of 35% or less.

A value of subtracting an amount value of oxygen of the adhesion enhancing layer from an amount value of oxygen of the lower light shielding layer may have an absolute value of 10% or less.

A value of subtracting an amount value of nitrogen of the adhesion enhancing layer from an amount value of nitrogen of the lower light shielding layer may have an absolute value of 10% or less.

A value of subtracting an amount of oxygen of the adhesion enhancing layer from an amount of oxygen from the amount value of oxygen of the second light shielding film may have an absolute value of 35% or less.

A value of subtracting an amount of nitrogen of the adhesion enhancing layer from an amount of nitrogen of the second light shielding film may have an absolute value of 25% or less.

An upper surface of the adhesion enhancing layer immediately after the formation of the adhesion enhancing layer may have an Rsk (skewness) value of −3 to −1.1.

The upper surface of the adhesion enhancing layer immediately after forming may have an Rsk (kurtosis) value of 5.5 or more.

The upper surface of the adhesion enhancing layer immediately after forming may have an Ra (arithmetic mean deviation roughness) of 0.4 nm to 3 nm.

A value of subtracting an amount of a transition metal of the lower light shielding layer from an amount of a transition metal of the second light shielding film may have an absolute value of 5% to 35%.

The transition metal may include at least any one among Cr, Ta, Ti and Hf.

In another general aspect, a photomask according to another embodiment of the present application includes a transparent substrate and a multilayer light shielding pattern film disposed on the light shielding area, the multilayer light shielding pattern film including a transition metal and at least any one between oxygen and nitrogen, the multilayer light shielding pattern film including a first light shielding film and a second light shielding film disposed on the first light shielding film, and the multilayer light shielding pattern film has a pEA (for photomask, Edge side Area damaged) value of 2 nm$^2$ or less according to Equation 2 below.

$$pEA = \frac{pBC - pAC}{2N} \qquad \text{[Equation 2]}$$

In the Equation 2, the pBC value is a sectional area of the multiplayer light shielding pattern film before cleaning is performed, the pAC value is a sectional area of the multilayer light shielding pattern film measured after the photomask is soaked in SC-1 (Standard Cleaning-1) solution for 800 seconds and rinsed by ozone water, the N value is the number of light shielding areas observed in the section of the photomask, the SC-1 solution is a solution including NH$_4$OH of 14.3% by weight, H$_2$O$_2$ of 14.3% by weight, and H$_2$O of 71.4% by weight, and the ozone water is a solution including an ozone concentration of 20 ppm (based on the weight) with ultrapure water as a solvent.

In another general aspect, a manufacturing method of a semiconductor element according to another embodiment includes a preparation of disposing a light source, a photomask, and a semiconductor water where a resist film have been applied, an exposure operation of selectively transmitting a light incident from the light source to the semiconductor wafer through the photomask to be transferred, and a development operation of developing a pattern on the semiconductor wafer, the photomask includes a transparent substrate, the transparent substrate includes a light shielding area, the photomask includes a multilayer light shielding pattern film disposed on the light shielding area, the multilayer light shielding pattern film includes a transition metal and at least any one between oxygen and nitrogen, the multilayer light shielding pattern film includes a first light shielding film and a second light shielding film disposed on the first light shielding film, and the multilayer light shielding pattern film has a pEA (for photomask, Edge side Area damaged) value of 2 nm$^2$ or less according to Equation 2 below.

$$pEA = \frac{pBC - pAC}{2N} \qquad \text{[Equation 2]}$$

In Equation 2, the pBC value is a sectional area of the multilayer light shielding pattern film measured before cleaning is performed, the pAC value is a sectional area of the multilayer light shielding pattern film measured after the photomask is soaked in SC-1 (Standard Cleaning-1) solution for 800 seconds and rinsed by ozone water, the N value is the number of light shielding areas observed in the section of the photomask, the SC-1 solution is a solution including NH$_4$OH of 14.3% by weight, H$_2$O$_2$ of 14.3% by weight, and H$_2$O of 71.4% by weight, and the ozone water is a solution including an ozone concentration of 20 ppm (based on the weight) with ultrapure water as a solvent.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
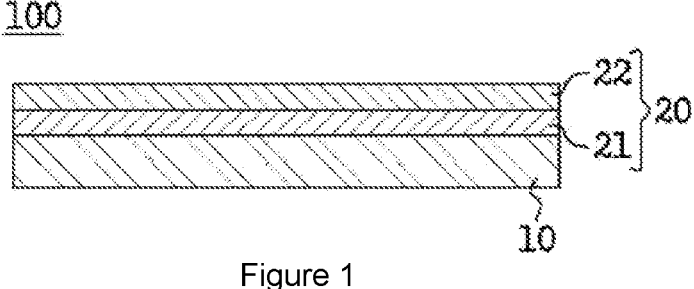
FIG. 1 illustrates a blank mask according to one embodiment.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

Throughout this application, the description of "A and/or B" means "A, B, or A and B."

Throughout this application, terms such as "first", "second", "A", or "B" are used to distinguish the same terms from each other unless specially stated otherwise.

In this application, "B being placed on A" means that B is placed in direct contact with A or placed over A with another layer or structure interposed therebetween and thus should not be interpreted as being limited to B being placed in direct contact with A.

In this application, a singular form is contextually interpreted as including a plural form as well as a singular form unless specially stated otherwise.

In this application, the surface profile refers to an outline shape observed in a surface.

In this application, "sectional area" refers to an area of section in a direction perpendicular to an upper surface of a blank mask.

Rsk value is a value evaluated in accordance with ISO_4287. Rsk value refers to skewness of the surface profile of a measuring target.

Rku value is a value evaluated in accordance with ISO_4287. Rku value refers to kurtosis of the surface profile of a measuring target.

A peak is a portion placed in the upper portion of a reference line (mean height line of surface profile) from the surface profile of a light shielding film.

A valley is a portion placed in the lower portion of a reference line from the surface profile of a light shielding film.

Rq value is a value evaluated in accordance with ISO_4287. Rq value is Root Mean Square Deviation (RMSD) of the surface profile of a measuring target.

Ra value is a value evaluated in accordance with ISO_4287. Ra value is arithmetic mean deviation roughness of the surface profile of a measuring target.

Rz value is a value evaluated in accordance with ISO_4287. Rz value is average roughness of 10-point scale of the surface profile of a measuring target.

Rpv value is the sum of the maximum peak height and the maximum valley depth within the surface of a measuring target.

In the present application, the room temperature refers to a temperature of 20° C. to 25° C.

Due to the high integration requirements for semiconductor devices, there is a demand for forming increasingly miniaturized circuit patterns on semiconductor wafers. As the Critical Dimension (CD) of a pattern developed on a semiconductor wafer is further decreased, the critical dimension of the pattern is required to be controlled as a further elaborate scale.

A cleaning process may be performed on a light shielding film, or a light shielding pattern film formed by patterning of the light shielding film. As a cleaning process, there are ordinary cleaning methods which are performed in order to remove organic matters and other foreign matters absorbed on the surface of the light shielding film. There is also an enhanced cleaning method which is performed in order to adjust the critical dimension of a light shielding pattern film within a photomask. The enhanced cleaning method may apply a cleaning solution whose oxidation force is relatively high or performed in a long time for cleaning.

Incidentally, in consideration of etching characteristics, optical properties, and the like, the light shielding film may be formed in a multilayer structure of two layers or more. The light shielding film in a multilayer structure may be damaged in a side surface of the light shielding film contacting with a cleaning solution, and particularly around the interface between layers within the side surface, when the enhanced cleaning method is performed. Because of the above identified considerations, embodiments of the present disclosure describe applying a light shielding film in a multilayer structure in which the difference in a sectional area of the light shielding film is decreased between before and after an operation of the enhanced cleaning. In some embodiments, the above identified damage and other problems in the related art may be addressed by embodiments of the film.

Hereinafter, the present disclosure will be described in detail.

FIG. 1 illustrates a blank mask 100 according to one embodiment disclosed in the present application. With reference to the FIG. 1, the blank mask 100 of the present disclosure is described.

In one or more embodiments, the blank mask 100 includes a transparent substrate 10 and a multilayer light shielding film 20 disposed on the transparent substrate 10.

In one or more embodiments, materials having a light transmitting characteristic with respect to an exposure light and which can be applicable to a blank mask 100 may be applied as the material of the transparent substrate 10. In one example, the transparent substrate 10 may have a transmittance of 85% or more with respect to an exposure light with the wavelength of 193 nm. In other instances, the transmittance may be 87% or more. In yet another example, the transmittance may be 99.99% or less. For example, the transparent substrate 10 may be a synthetic quartz substrate. In such a case, the transparent substrate 10 can suppress attenuation of a light transmitted to the transparent substrate 10.

Additionally, the transparent substrate 10 may suppress the occurrence of optical distortion by adjusting the surface characteristics such as flatness and roughness.

In one or more embodiments, a multilayer light shielding film 20 may be disposed on the top side of the transparent substrate 10.

The multilayer light shielding film 20 may have a characteristic of at least partially blocking an exposure light incident to the bottom side of the transparent substrate 10. In addition, referring to FIG. 3 discussed below, when a phase shift film 30, or the like, is placed between the transparent substrate 10 and the multilayer light shielding film 20, the multilayer light shielding film 20 may be used as an etching mask in a process of etching the phase shift film 30 and the like to be a pattern shape.

In one or more embodiments, the multilayer light shielding film 20 includes a transition metal and at least any one of oxygen and nitrogen.

The multilayer light shielding film 20 may also include a first light shielding film 21 and a second light shielding film 22 disposed on the first light shielding film 21.

In one embodiment, the first light shielding film 21 and the second light shielding film 22 each have a different amount of transition metals from each other.

Durability of Light Shielding Film Against Cleaning Solution

In one or more embodiments, a multilayer light shielding film 20 may include an EA (Edge side Area damaged) value of 2 nm² or less according to Equation 1 below.

$$EA = \frac{BC - AC}{2} \qquad \text{[Equation 1]}$$

In Equation 1, the BC value is a sectional area of the multilayer light shielding film 20 measured before cleaning is performed.

The AC value is a sectional area of the multilayer light shielding film 20 measured after the blank mask 100 is soaked in SC-1 (Standard Cleaning-1) solution for 800 seconds and rinsed with ozone water.

The SC-1 solution is a solution including $NH_4OH$ of 14.3% by weight, $H_2O_2$ of 14.3% by weight, and $H_2O$ of 71.4% by weight.

The ozone water is a solution including an ozone concentration of 20 ppm (based on the weight) with ultrapure water as a solvent.

In the light shielding film having a multilayer structure, each layer of the light shielding film may have a considerable difference in its properties from those of an adjacent layer. Due to this, there may not be sufficient adhesive force having a sufficient strength provided in an interface between these layers.

In one or more embodiments of a process of performing the enhanced cleaning, damage including a loss of some parts including the light shielding film may occur in an area that has relatively weak mechanical properties within the surface of the light shielding film that comes into contact with a cleaning solution. It is increasingly likely that this damage around an interface between layers within a side surface of the light shielding film may be relatively increased when the light shielding film has a multilayer structure.

Embodiments of the present disclosure apply a multilayer light shielding film having a decreased EA value, which is a difference in the size of the multilayer light shielding film measured before and after the enhanced cleaning, which may allow the light shielding film to have a stable durability even though an enhanced cleaning is performed.

One embodiment of the method of measuring an EA (Edge side Area damaged) value of the multilayer light shielding film 20 is described below.

In one or more embodiments, a blank mask 100 is cut to a size of 15 mm vertically and horizontally, and a surface of the processed blank mask is exemplarily treated by FIB (Focused Ion Beam). Thereafter, a section image of the processed blank mask is measured through TEM (Transmission Electron Microscopy). TEM measuring apparatus may be for example, JEM 2100F HR model available from JEOL LTD. ABC value is calculated from the section image of the blank mask.

In one example, the cut blank mask is soaked in SC-1 solution for 800 seconds and the enhanced cleaning is performed for the blank mask. $NH_4OH$ of 14.3% by weight, $H_2O_2$ of 14.3% by weight, and $H_2O$ of 71.4% by weight are applied to the SC-1 solution. Thereafter, the processed blank mask is taken out from the solution and the solution remaining on the surface of the processed blank mask is removed by using ozone water. The ozone water is applied by a solution made of an ozone concentration of 20 ppm (based on the weight) with ultrapure water as a solvent. Soaking in SC-1 solution and rinsing by ozone water are performed at a room temperature.

Thereafter, AC value is measured by the same method as the method of measuring BC value. Subsequently, the EA value of the blank mask 100 is calculated from the measured BC value and AC value.

The multilayer light shielding film 20 may have an EA value of 2 nm² or less. The EA value may be 1.5 nm² or less. The EA value may be 1.4 nm² or less. The EA value may be 1 nm² or less. The EA value may be 0.1 nm² or more. The EA value may be 0.3 nm² or more. In such a case, damage of the light shielding film caused from the enhanced cleaning can be effectively decreased.

Roughness Characteristic and Thickness of Adhesion Enhancing Layer

Figure 2:
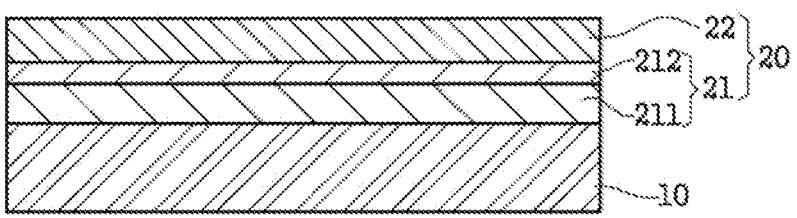
FIG. 2 illustrates another blank mask according to another embodiment.

FIG. 2 is an illustration of a blank mask according to one or more embodiments of the present application. Referring to FIG. 2, an embodiment of a blank mask 200 is illustrated.

In one embodiment of the blank mask 200, a first light shielding film 21 may include a lower light shielding layer 211 and an adhesion enhancing layer 212 disposed on the lower light shielding layer 211.

In one embodiment, a second light shielding film 22 may be disposed on the adhesion enhancing layer 212.

In one embodiment, the adhesion enhancing layer 212 is applied to the first light shielding film 21, which may improve the adhesion force between the first light shielding film 21 and other thin films formed in contact with the first light shielding film 21, such as the second light shielding film 22. In some examples, each thin film may have a different composition within the multilayer light shielding film 20 in such an arrangement and manner so as be able to improve the chemical adhesion between each of the thin films provided in different embodiments of blank mask 200. In additional examples, the adhesion enhancing layer 212 may be controlled in its roughness characteristic which may then be applied to the first light shielding film 21 to improve the physical adhesion because a size of an area contacting the adhesion enhancing layer 212 and another thin film laminated on the adhesion enhancing layer 212 is increased.

In some examples, the adhesion enhancing layer 212 may have a thickness of 1 Å to 15 Å.

In one example of a method of forming the adhesion enhancing layer 212 for the blank mask 200, particles may be sporadically sputtered onto and deposited on the target surface to be formed to form a adhesion enhancing layer 212 and the surface of the adhesion enhancing layer 212 may then be allowed to form a rough surface. However, if the sputtering is performed for longer than a desired amount of time, additional, unwanted particles from the sputtering step may be deposited between the particles deposited in the sporadic manner described above. In this instance over an overlong sputtering step, the roughness of the surface of the adhesion enhancing layer 212 may become lower than a desired roughness being addressed in embodiments of the present disclosure. Embodiments of the present disclosure may control the thickness of the adhesion enhancing layer 212 and may allow the surface of the adhesion enhancing layer 212 to have a roughness characteristic suitable for improving the adhesion force between layers within the multilayer light shielding film 20.

The thickness of the adhesion enhancing layer 212 may be measured through a TEM image measurement. The method of measuring TEM image may be the same as the method applied to the measurement of EA value as described above.

In some embodiments, the adhesion enhancing layer 212 may have a thickness of 1 Å to 15 Å. The thickness may be 3 Å or more. The thickness may be 5 Å or more. The thickness may be 15 Å or less. The thickness may be 10 Å or less. In such a case, it is possible to improve the mechanical adhesion force between a thin film contacted with the upper surface of the adhesion enhancing layer 212 and the adhesion enhancing layer 212.

In some examples, at a time point after the forming of the adhesion enhancing layer 212, the upper surface of the adhesion enhancing layer 212 may have an Rsk (skewness) value of −3 to −1.1.

In some examples of the blank mask 200 having the above-described sputtered surface, when a skewness thereof is not controlled, a shape of a peak may be formed which may have a tendency of being easily broken by an external impact. In consideration of the above problem, embodiments of the present disclosure may control the skewness of the upper surface of the adhesion enhancing layer 212 immediately after forming. Through this control, the surface area of the adhesion enhancing layer 212 may be increased, and simultaneously, the amount of particles generated due to damage of peaks in a process of sputtering another thin film to the surface of the adhesion enhancing layer 212 may be decreased.

One embodiment of a method of measuring Rsk (skewness) value of the upper surface of the adhesion enhancing layer 212 is described below.

In one or more embodiments, a Rsk (skewness) value is measured in an area of 1 μm vertically and horizontally placed at the center of the surface of the adhesion enhancing layer 212. The Rsk (skewness) value is measured by using two-dimensional roughness meter set to have the scan speed of 0.5 Hz in Non-contact mode. For example, the Rsk (skewness) value may be measured by applying XE-150 model available from Park Systems applied with PPP-NCHR which is Cantilever model available from Park System as a probe.

Immediately after being formed, the upper surface of the adhesion enhancing layer 212 may have an Rsk value (skewness) of −3 to −1.1. The Rsk (skewness) value may be −2.5 or more. The Rsk (skewness) value may be −2 or more. The Rsk (skewness) value may be −1.2. or less. The Rsk (skewness) value may be −1.5 or less. In such a case, it is possible to decrease an amount of particles generated from the surface of the adhesion enhancing layer 212, while increasing the surface area of the adhesion enhancing layer 212.

The upper surface of the adhesion enhancing layer 212 immediately after the forming may have the Rku (kurtosis) value of 5.5 or more.

In one embodiment, the kurtosis characteristic of the upper surface of the adhesion enhancing layer 212 can be suitably controlled. Through the above, the lower surface of another thin film formed in contact with the upper surface of the adhesion enhancing layer 212 can be further strongly adhered to the upper surface of the adhesion enhancing layer 212.

Accordingly, one exemplary method of measuring an Rku (kurtosis) value of the upper surface of the adhesion enhancing layer 212 which may be a same method as the method of measuring an Rsk (skewness) value earlier described.

The upper surface of the adhesion enhancing layer 212 immediately after forming may have the Rku (kurtosis) value of 5.5 or more. The Rku (kurtosis) value may be 7 or more. The Rku (kurtosis) value may be 10 or more. The Rku (kurtosis) value may be 20 or less. The Rku (kurtosis) value may be 18 or less. The Rku (kurtosis) value may be 15 or less. The Rku (kurtosis) value may be 13 or less. In such a case, it is possible to enhance the adhesion force between the adhesion enhancing layer 212 and a thin film in contact with the upper surface of the adhesion enhancing layer 212.

In one or more embodiments, the surface roughness of the upper surface of the adhesion enhancing layer 212 may be controlled to enhance the durability of the multilayer light shielding film 20 further in an enhanced cleaning, and simultaneously the same surface roughness can also be controlled to effectively suppress the variation of optical properties in the in-plane direction of the adhesion enhancing layer 212.

In yet other examples, the Ra (arithmetic mean deviation roughness) value, Rq (root mean square deviation roughness) value, Rz (10-point average roughness) value, and Rpv (sum of the maximum peak height and the maximum valley depth) value may be measured in the same method as the method of measuring an Rsk (skewness) value as described above.

In some embodiments, the upper surface of adhesion enhancing layer 212 may have the Rq (root mean square deviation) value of 0.5 nm to 3 nm immediately after its formation. The Rq (root mean square deviation) value may be 0.7 nm or more. The Rq (root mean square deviation) value may be 2 nm or less. The Rq (root mean square deviation) value may be 1.5 nm or less. The Rq (root mean square deviation) value may be 1.1 nm or less.

The upper surface of the adhesion enhancing layer 212 immediately after forming may have an Ra (arithmetic mean deviation) value of 0.4 nm or more. The Rq (arithmetic mean deviation) value may be 0.5 nm or more. The Ra (arithmetic mean deviation) value may be 3 nm or less. The Ra (arithmetic mean deviation) value may be 2 nm or less. The Ra (arithmetic mean deviation) value may be 1 nm or less. The Ra (arithmetic mean deviation) value may be 0.9 nm or less.

In one or more embodiments, the upper surface of the adhesion enhancing layer 212 immediately after the forming may have an Rz (10-point average roughness) value which may be 6.5 nm or more. The Rz (10-point average roughness) value may be 7 nm or more. The Rz (10-point average roughness) value may be 8 nm or more. The Rz (10-point average roughness) value may be 20 nm or less. The Rz (10-point average roughness) value may be 10 nm or less.

In one or more embodiments, the upper surface of adhesion enhancing layer 212 may have an Rpv (sum of the maximum peak height and the maximum valley depth) value of 6 nm or more immediately after formation. The Rpv (sum of the maximum peak height and the maximum valley depth) value may be 7 nm or more. The Rpv (sum of the maximum peak height and the maximum valley depth) value may be 7.2 nm or more. The Rpv (sum of the maximum peak height and the maximum valley depth) value may be 8 nm or more. The Rpv (sum of the maximum peak height and the maximum valley depth) value may be 10 nm or less. The Rpv (sum of the maximum peak height and the maximum valley depth) value may be 9 nm or less. The Rpv (sum of the maximum peak height and the maximum valley depth) value may be 8.8 nm or less.

In these examples, damage of the side surface of the multilayer light shielding film 20 caused from a cleaning solution during its cleaning process can be effectively suppressed, and the variation of optical properties of the multilayer light shielding film 20 in the in-plane direction can be effectively suppressed.

Composition of Adhesion Enhancing Layer

In one or more embodiments, by controlling the variation of the composition between the adhesion enhancing layer 212 and the lower light shielding layer 211 and the variation of the composition between the adhesion enhancing layer 212 and the second light shielding film 22, the durability of the multilayer light shielding film 20 against a cleaning solution may be enhanced.

Specifically, a difference in the composition of the adhesion enhancing layer 212 and the lower light shielding layer 211. In particular, an exemplary difference in an amount of a transition metal may be controlled and thereby a property variation such as surface energy between the adhesion enhancing layer 212 and the lower light shielding layer 211 may be adjusted. Through the above example, a bond between elements on the surface of the adhesion enhancing layer 212 and elements on the surface of the lower light shielding layer 211 may be easily formed and the adhesion between the adhesion enhancing layer 212 and the lower light shielding layer 211 may have an improved adhesive force. In the same way, the variation in the amount of a transition metal between the adhesion enhancing layer 212 and the second light shielding film 22 may be controlled in some embodiments and thereby an excellent adhesion force may result between the adhesion enhancing layer 212 and the second light shielding film 22. As a result, it is possible to form a multilayer light shielding film having an enhanced durability against a cleaning solution compared to a multilayer light shielding film formed without application of embodiments of the adhesion enhancing layer 212.

In some embodiments, an amount of the lower light shielding layer 211, adhesion enhancing layer 212, and the second light shielding film 22 may be confirmed by measurement of the depth profile of the light shielding film using XPS (X-ray Photoelectron Spectroscopy). In one example, a blank mask may be cut to have a size of 15 mm vertically and horizontally as a prepared sample. Thereafter, the sample may be disposed in XPS measuring apparatus, and an area in the width of 4 mm and the length of 2 mm placed at the center of the sample can be etched and the amount of a transition metal of each thin film is measured.

For example, the amounts by elements of each thin film may be measured by K-alpha model available from Thermo Scientific.

In one or more embodiments, an absolute value of a value of subtracting an amount of a transition metal of the adhesion enhancing layer 212 from an amount of a transition metal of the lower light shielding layer 211 may be 10% or less. The absolute value may be 8% or less. The absolute value may be 5% or less. The absolute value may be 0% or more.

In one or more embodiments, an absolute value of a value of oxygen amount of the adhesion enhancing layer 212 being subtracted from an oxygen amount value of the lower light shielding layer 21 may be 10% or less. The absolute value may be 8% or less. The absolute value may be 5% or less. The absolute value may be more than zero.

In one or more embodiments, an absolute value of a value of a nitrogen amount of the adhesion enhancing layer 212 subtracted from a nitrogen amount value of the lower light shielding layer 211 may be 10% or less. The absolute value may be 8% or less. The absolute value may be 5% or less. The absolute value may be 0% or more.

In these exemplary cases, in the interface where the lower light shielding layer 211 and the adhesion enhancing layer 212 meet, a strong adhesion force may be formed.

An absolute value of a value of subtracting an amount of a transition metal of the adhesion enhancing layer 212 from an amount of a transition metal of the second light shielding film 22 may be 35% or less. The absolute value may be 30% or less. The absolute value may be 25% or less. The absolute value may be 10% or more. The absolute value may be 15% or more. The absolute value may be 20% or more.

An absolute value of a value of subtracting oxygen amount of the adhesion enhancing layer 212 from oxygen amount of the second light shielding film 22 may be 25% or less. The absolute value may be 30% or less. The absolute value may be 10% or more. The absolute value may be 15% or more. The absolute value may be 20% or more.

The absolute value of a value of subtracting nitrogen amount of the adhesion enhancing layer 212 from nitrogen amount of the second light shielding film 22 may be 25% or less. The absolute value may be 20% or less. The absolute value may be 15% or less. The absolute value may be 5% or more.

In such a case, the multilayer light shielding film can exhibit stable durability in a cleaning process for a long time even though it has a multilayer structure.

The adhesion enhancing layer 212 may include a transition metal, oxygen and nitrogen. The adhesion enhancing layer 212 may include a transition metal in an amount of 30% or more. The adhesion enhancing layer 212 may include a transition metal in an amount of 35% or more. The adhesion enhancing layer 212 may include a transition metal in an amount of 38% or more. The adhesion enhancing layer 212 may include a transition metal in an amount of 60% or less. The adhesion enhancing layer 212 may include a transition metal in an amount of 55% or less. The adhesion enhancing layer 212 may include a transition metal in an amount of 45% or less.

The sum of the oxygen amount and the nitrogen amount of the adhesion enhancing layer 212 may be 25% or more. The value may be 40% or more. The value may be 45% or more. The value may be 80% or less. The value may be 60% or less. The value may be 55% or less.

The adhesion enhancing layer 212 may include oxygen in an amount of 20% or more. The adhesion enhancing layer 212 may include oxygen in an amount of 30% or more. The adhesion enhancing layer 212 may include oxygen in an amount of 35% or more. The adhesion enhancing layer 212 may include oxygen in an amount of 60% or less. The adhesion enhancing layer 212 may include oxygen in an amount of 50% or less. The adhesion enhancing layer 212 may include oxygen in an amount of 45% or less.

The adhesion enhancing layer 212 may include nitrogen in an amount of 5% or more. The adhesion enhancing layer 212 may include nitrogen in an amount of 7% or more. The adhesion enhancing layer 212 may include nitrogen in an amount of 20% or less. The adhesion enhancing layer 212 may include nitrogen in an amount of 15% or less.

The adhesion enhancing layer 212 may include carbon in an amount of 5% or more. The adhesion enhancing layer 212 may include carbon in an amount of 7% or more. The adhesion enhancing layer 212 may include carbon in an amount of 20% or less. The adhesion enhancing layer 212 may include carbon in an amount of 15% or less.

In such a case, it is possible to decrease the difference in the surface energy between the adhesion enhancing layer and an adjacent layer of the adhesion enhancing layer (particularly, the lower light shielding layer or the second light shielding film).

Composition and Thickness of Multilayer Light Shielding Film

In one or more embodiments, the multilayer light shielding film 20 may be patterned through dry etching. In the process of dry etching, the upper portion of the multilayer light shielding film 20 may be exposed for a relatively long time compared to the lower portion. Because of the time differential, the multilayer light shielding pattern film may have a difficulty in achieving a desired shape.

One or more embodiments of the present disclosure can control the composition, thickness, process condition during sputtering, and the like of a thin film included in the multilayer light shielding film 20, in consideration of the optical properties required for the multilayer light shielding film 20, the shape of the multilayer light shielding pattern film 20 formed through patterning, and the like.

The first light shielding film 21 may include a transition metal, oxygen, and nitrogen. The first light shielding film 21 may include a transition metal in an amount of 30% or more. The first light shielding film may include a transition meal in an amount of 35% or more. The first light shielding film 21 may include a transition metal in an amount of 38% or more. The first light shielding film 21 may include a transition metal in an amount of 60% or less. The first light shielding film 21 may include a transition metal in an amount of 55% or less. The first light shielding film 21 may include a transition metal in an amount of 45% or less.

The sum of oxygen amount and nitrogen amount of the first light shielding film 21 may be 25% or more. The value may be 40% or more. The value may be 45% or more. The value may be 80% or less. The value may be 60% or less. The value may be 55% or less.

The first light shielding film 21 may include oxygen in an amount of 20% or more. The first light shielding film 21 may include oxygen in an amount of 30% or more. The first light shielding film 21 may include oxygen in an amount of 35% or more. The first light shielding film 21 may include oxygen in an amount of 60% or less. The first light shielding film 21 may include oxygen in an amount of 50% or less. The first light shielding film 21 may include oxygen in an amount of 45% or less.

The first light shielding film 21 may include nitrogen in an amount of 5% or more. The first light shielding film 21 may include nitrogen in an amount of 7% or more. The first light shielding film 21 may include nitrogen in an amount of 20% or less. The first light shielding film 21 may include nitrogen in an amount of 15% or less.

The first light shielding film 21 may include carbon in an amount of 5% or more. The first light shielding film 21 may include carbon in an amount of 7% or more. The first light shielding film 21 may include carbon in an amount of 20% or less. The first light shielding film 21 may include carbon in an amount of 15% or less.

The lower light shielding layer 211 may include a transition metal, oxygen, and nitrogen. The lower light shielding layer 211 may include a transition metal in an amount of 30% or more. The lower light shielding layer 211 may include a transition metal in an amount of 35% or more. The lower light shielding layer 211 may include a transition metal in an amount of 38% or more. The lower light shielding layer 211 may include a transition metal in an amount of 60% or less. The lower light shielding layer 211 may include a transition metal in an amount of 55% or less. The lower light shielding layer 211 may include a transition metal in an amount of 45% or less.

The sum of the oxygen amount and the nitrogen amount of the lower light shielding layer 211 may be 25% or more. The value may be 40% or more. The value may be 45% or more. The value may be 80% or less. The value may be 60% or less. The value may be 55% or less.

The lower light shielding layer 211 may include oxygen in an amount of 20% or more. The lower light shielding layer 211 may include oxygen in an amount of 30% or more. The lower light shielding layer 211 may include oxygen in an amount of 35% or more. The lower light shielding layer may include oxygen in an amount of 60% less. The lower light shielding layer may include oxygen in an amount of 50% less. The lower light shielding layer may include oxygen in an amount of 45% less.

The lower light shielding layer 211 may include nitrogen in an amount of 5% or more. The lower light shielding layer 211 may include nitrogen in an amount of 7% or more. The lower light shielding layer 211 may include nitrogen in an amount of 20% or less. The lower light shielding layer 211 may include nitrogen in an amount of 15% or less.

The lower light shielding layer 211 may include carbon in an amount of 5% or more. The lower light shielding layer 211 may include carbon in an amount of 7% or more. The lower light shielding layer 211 may include carbon in an amount of 20% or less. The lower light shielding layer 211 may include carbon in an amount of 15% or less.

In such a case, the first light shielding film 21 can help the multilayer light shielding film to have an excellent extinction characteristic and can help to perform further elaborate dry etching to the multilayer light shielding film.

The second light shielding film 22 may include a transition metal, and oxygen and/or nitrogen. The second light shielding film 22 may include a transition metal in an amount of 50% or more. The second light shielding film 22 may include a transition metal in an amount of 55% or more. The second light shielding film 22 may include a transition metal in an amount of 60% or more. The second light shielding film 22 may include a transition metal in an amount of 80% or less. The second light shielding film 22 may include a transition metal in an amount of 75% or less. The second light shielding film 22 may include a transition metal in an amount of 70% or less.

The sum of the oxygen amount and the nitrogen amount of the second light shielding film 22 may be 10% or more. The value may be 20% or more. The value may be 25% or more. The value may be 60% or less. The value may be 40% or less. The value may be 35% or less.

The second light shielding film 22 may include oxygen in an amount of 5% or more. The second light shielding film 22 may include oxygen in an amount of 20% or less. The second light shielding film 22 may include oxygen in an amount of 15% or less.

The second light shielding film 22 may include nitrogen in an amount of 5% or more. The second light shielding film 22 may include nitrogen in an amount of 10% or more. The second light shielding film 22 may include nitrogen in an amount of 15% or more. The second light shielding film 22 may include nitrogen in an amount of 40% or less. The second light shielding film 22 may include nitrogen in an amount of 30% or less. The second light shielding film 22 may include nitrogen in an amount of 25% or less.

The second light shielding film 22 may include carbon in an amount of 1% or more. The second light shielding film 22 may include carbon in an amount of 10% or less. The second light shielding film 22 may include carbon in an amount of 7% or less. The second light shielding film 22 may include carbon in an amount of 5% or less.

In such a case, it is possible to help the multilayer light shielding film to have optical properties suitable for a defect test, while obtaining an excellent extinction characteristic. In addition, it is possible to help the multilayer light shielding pattern film, which is formed from the multilayer light shielding film, to be formed according to its predesigned shape.

The absolute value of a value of subtracting the amount of a transition metal of the lower light shielding layer 211 from the amount of a transition metal of the second light shielding film 22 may be 35% or less. The absolute value may be 30% or less. The absolute value may be 25% or less. The absolute value may be 5% or more. The absolute value may be 10% or more. The absolute value may be 15% or more. The absolute value may be 20% or more.

The absolute value of a value of subtracting the oxygen amount of the lower light shielding layer 211 from the oxygen amount of the second light shielding film 22 may be 35% or less. The absolute value may be 30% or less. The absolute value may be 10% or more. The absolute value may be 15% or more. The absolute value may be 20% or more.

The absolute value of a value of subtracting the nitrogen amount of the lower light shielding layer 211 from the nitrogen amount of the second light shielding film 22 may be 25% or less. The absolute value may be 20% or less. The absolute value may be 15% or less. The absolute value may be 5% or more.

When applying the adhesion enhancing layer 212 between the second light shielding film 22 and the lower light shielding layer 211 having such compositions, the effect of adhesion improvement by the adhesion enhancing layer can be increased further.

The transition metal may include at least any one among Cr, Ta, Ti and Hf. The transition metal may be Cr.

The first light shielding film 21 may have a thickness of 250 to 650 Å. The first light shielding film 21 may have a thickness of 350 to 600 Å. The first light shielding film 21 may have a thickness of 400 to 550 Å.

The lower light shielding layer 211 may have a thickness of 250 to 650 Å. The lower light shielding layer 211 may have a thickness of 350 to 600 Å. The lower light shielding layer 211 may have a thickness of 400 to 550 Å.

In such a case, it is possible to help the first light shielding film 21 to have an excellent extinction characteristic.

The second light shielding film 22 may have a thickness of 30 to 200 Å. The second light shielding film 22 may have a thickness of 30 to 100 Å. The second light shielding film 22 may have a thickness of 40 to 80 Å. In such a case, the multilayer light shielding film can be patterned further elaborately and thereby the resolution of a photomask can be improved further.

The ratio of the thickness of the second light shielding film 22 to the thickness of the first light shielding film 21 may be a value of 0.05 to 0.3. The thickness ratio may be a value of 0.07 to 0.25. The thickness ratio may be a value of 0.1 to 0.2. In such a case, it is possible to control the side shape of the multilayer light shielding pattern film formed through patterning further elaborately.

The ratio of the thickness of the adhesion enhancing layer to the thickness of the first light shielding film 21 may be a value of 0.005 to 0.05. The thickness ratio may be a value of 0.01 to 0.04. The thickness ratio may be a value of 0.015 to 0.03. In such a case, the multilayer light shielding film can have stable durability against a cleaning solution.

Optical Properties of Multilayer Light Shielding Film

The multilayer light shielding film 20 may have an optical density of 1.3 or more with respect to a light with the wavelength of 193 nm. The multilayer light shielding film 20 may have an optical density of 1.4 or more with respect to a light with the wavelength of 193 nm.

The multilayer light shielding film 20 may have a transmittance of 2% or less with respect to a light with the wavelength of 193 nm. The multilayer light shielding film 20 may have a transmittance of 1.9% or less with respect to a light with the wavelength of 193 nm.

In such a case, the multilayer light shielding film can help the transmission of an exposure light to be effectively blocked.

The optical density and transmittance of the multilayer light shielding film may be measured through the use of a spectroscopic ellipsometer. For example, the optical density and transmittance of the multilayer light shielding film may be measured by using a MG-pro model available from Nano-View Co., Ltd.

Other Thin Film

Figure 3:
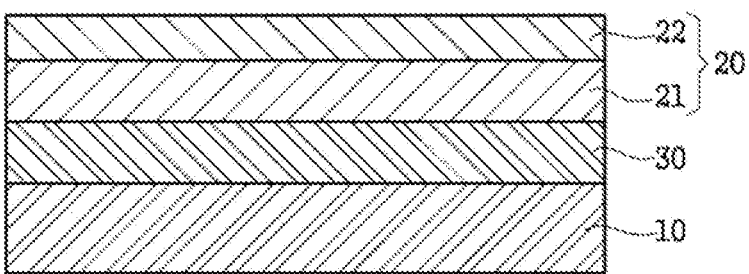
FIG. 3 illustrates yet another blank mask according to another embodiment.

FIG. 3 illustrates a blank mask 300 according to another embodiment.

Embodiments of blank mask 300 may include phase shift film 30 that is disposed between a transparent substrate 10 and a multilayer light shielding film 20. The phase shift film 30 may be a thin film for attenuating the light intensity of an exposure light transmitting the phase shift film 30 and adjusting the phase difference of the exposure light to suppress a diffraction of light occurring at the edge of a transcription pattern, substantially.

The phase shift film 30 may have a phase difference of 170 to 190° with respect to a light with the wavelength of 193 nm. The phase shift film 30 may have a phase difference of 175 to 185° with respect to a light with the wavelength of 193 nm.

The phase shift film 30 may have a transmittance of 3 to 10% with respect to a light with the wavelength of 193 nm. The phase shift film 30 may have a transmittance of 4 to 8% with respect to a light with the wavelength of 193 nm.

In such a case, a diffraction light causable at the edge of a pattern film can be effectively suppressed.

A thin film including the phase shift film 30 and the multilayer light shielding film 20 may have an optical density of 3 or more with respect to a light with the wavelength of 193 nm. A thin film including the phase shift film 30 and the multilayer light shielding film 20 may have an optical density of 3.2 or more with respect to a light with the wavelength of 193 nm. In such a case, the thin film can effectively suppress a transmission of an exposure light.

The phase difference and transmittance of the phase shift film 30 and the optical density of the thin film including the phase shift film 30 and the multilayer light shielding film 20 may be measured by using of a spectroscopic ellipsometer. For example, an MG-Pro model available from Nano-View Co., Ltd may be used as the spectroscopic ellipsometer.

The phase shift film 30 may include a transition metal and silicon. The phase shift film 30 may include a transition metal, silicon, oxygen, and nitrogen. The transition metal may be molybdenum.

A hard mask (not shown) may be placed on the multilayer light shielding film 20. The hard mask may function as an etching mask film when a light shielding film 20 pattern is etched. The hard mask may include silicon, nitrogen, and oxygen.

Photomask

Figure 4:
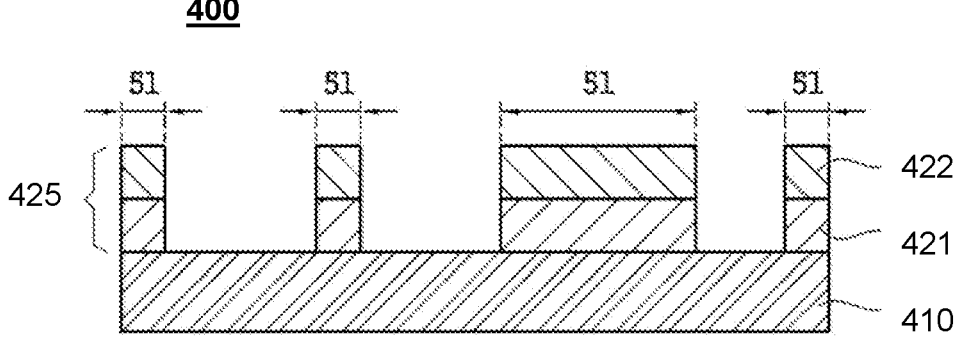
FIG. 4 illustrates a photomask according to another embodiment.

FIG. 4 illustrates a photomask 400 according to another embodiment.

Referring to FIG. 4, embodiments of photomask 400 according to another embodiment may include a transparent substrate 410.

The transparent substrate 410 may include a light shielding area 451.

Embodiments of the photomask 400 may include a multilayer light shielding pattern film 425 disposed on the light shielding area.

Embodiments of the multilayer light shielding pattern film 425 may include a transition metal and at least any one between oxygen and nitrogen.

Embodiments of the multilayer light shielding pattern film 425 may also include a first light shielding film 421 and a second light shielding film 422 disposed on the first light shielding film 421.

Embodiments of the multilayer light shielding pattern film 425 may have a pEA (for photomask, Edge side Area damaged) value of 2 nm² or less according to Equation 2 below.

$$pEA = \frac{pBC - pAC}{2N} \qquad \text{[Equation 2]}$$

In the Equation 2, the pBC value is a sectional area of the multilayer light shielding pattern film 425 measured before cleaning is performed.

The pAC value of a sectional area of the multilayer light shielding pattern film 425 measured after the photomask 200 is soaked for 800 seconds in SC-1 solution and rinsed by ozone water.

The N value is the number of light shielding areas observed at the section of the photomask.

The SC-1 solution is a solution including $NH_4OH$ of 14.3% by weight, $H_2O_2$ of 14.3% by weight, and $H_2O$ of 71.4% by weight.

The ozone water is a solution including an ozone concentration of 20 ppm (based on the weight) with ultrapure water applied as a solvent.

The description of the transparent substrate 410 included in the photomask 400 is overlapped with the above description and thus omitted.

In one or more embodiments, the light shielding area 51 may be an area where the multilayer light shielding pattern film is disposed, within the surface of the transparent substrate.

A method of measuring pEA value of the multilayer light shielding pattern film is the same as the method of measuring EA value of the multilayer light shielding film as described above. However, the measuring target is a multilayer light shielding pattern film, which is different than the method described above for a multilayer light shielding film, and pEA value is calculated according to Equation 2 instead of an EA value according to Equation 1.

The multilayer light shielding pattern film 425 may be formed by patterning of the multilayer light shielding film 420 described above.

The descriptions of the layer structure, properties, composition, and the like of the multilayer light shielding pattern film 425 are similar to the above description of the light shielding film and thus omitted.

Manufacturing Method of Multilayer Light Shielding Film

A manufacturing method of a blank mask according to one or more embodiments of the present application includes a preparation of disposing a sputtering target including a transition metal and a transparent substrate in a sputtering chamber; a first light shielding film formation operation for forming a first light shielding film on the transparent substrate; and a second light shielding film formation operation for forming a second light shielding film.

The first light shielding film formation operation includes a lower light shielding layer formation process for forming a lower light shielding layer on the transparent substrate; and an adhesion enhancing layer formation process of forming an adhesion enhancing layer of the formed lower light shielding layer.

In the preparation, the sputtering target may be selected in consideration of the composition of a light shielding film, when the light shielding film is formed. The sputtering target may be applied by one target containing a transition metal. The sputtering target may be applied by two or more targets including one target containing a transition metal. The sputtering target containing a transition metal may include the transition metal in an amount of 90% or more. The sputtering target containing a transition metal may include the transition metal in an amount of 95% or more. The sputtering target containing a transition metal may include the transition metal in an amount of 99 at % or more.

The transition metal may include at least any one among Cr, Ta, Ti, and Hf. The transition metal may include Cr.

The description of the transparent substrate disposed in the sputtering chamber is similar to the above description and thus omitted.

In the preparation, a magnet may be disposed in the sputtering chamber. The magnet may be disposed in the surface opposite to one surface where sputtering is performed from the sputtering target.

In the multilayer light shielding film formation operation, the process condition of sputtering may be applied differently by thin films respectively included in the multilayer light shielding film. In detail, in consideration of a surface roughness characteristic, chemical resistance, an extinction characteristic, an etching characteristic, and the like, various process conditions such as the composition of an atmospheric gas, a pressure in a chamber, an electric power supplied to the sputtering target, a time for film formation, and a speed of substrate rotation may be applied differently to respective thin films.

The atmospheric gas may include an inert gas, a reactive gas, and a sputtering gas. The inert gas is a gas not being an element constituting the formed thin film. The reactive gas is a gas including an element constituting the formed thin film. The sputtering gas is a gas colliding with a target by ionization in a plasma atmosphere.

The inert gas may include helium.

The reactive gas may include a gas including nitrogen elements. The gas including nitrogen elements may be for example, $N_2$, NO, $NO_2$, $N_2O$, $N_2O_3$, $N_2O_4$, $N_2O_5$ or the like. The reactive gas may include a gas including oxygen elements. The gas including oxygen elements may be for example, $O_2$, $CO_2$, or the like. The reactive gas may include a gas including nitrogen elements and a gas including oxygen elements. The reactive gas may include a gas including both nitrogen elements and oxygen elements. The gas including both nitrogen elements and oxygen elements may be for example, NO, $NO_2$, $N_2O$, $N_2O_3$, $N_2O_4$, $N_2O_5$, or the like.

The sputtering gas may be Ar gas.

A power source for supplying an electric power to the sputtering target may be DC power source, or RF power source.

In the first light shielding film formation operation, a lower light shielding layer may be formed first.

In the lower light shielding layer formation operation, an electric power of 1.5 kW to 2.5 kW may be supplied to a sputtering target. An electric power of 1.6 kW to 2 kW may be supplied to the sputtering target.

In the lower light shielding layer formation process, the ratio of the flow rate of a reactive gas to the flow rate of an inert gas may be a value of 1.5 to 3. The ratio of flow rate may be a value of 1.8 to 2.7. The ratio of flow rate may be a value of 2 to 2.5.

In the atmospheric gas, the ratio of the oxygen amount to the nitrogen amount included in the reactive gas may be a value of 1.5 to 4. The ratio may be a value of 2 to 3. The ratio may be a value of 2.2 to 2.7.

In such a case, the lower light shielding layer can help the multilayer light shielding film to have a sufficient extinction characteristic. Additionally, in the process of patterning the multilayer light shielding film, the lower light shielding layer can help the shape of the multilayer light shielding pattern film to be controlled elaborately.

In one or more embodiments, the formation of the lower light shielding layer may be performed for a time of 200 second to 300 seconds. The formation of the lower light shielding layer may be performed for a time of 210 seconds to 240 seconds. In such a case, it is possible to help the multilayer light shielding film to have a sufficient extinction characteristic.

The adhesion enhancing layer may be formed on the lower light shielding layer. The adhesion enhancing layer may be formed on the upper surface of the lower light shielding layer. The adhesion enhancing layer may be formed on the upper surface of another thin film disposed on the lower light shielding layer.

In the adhesion enhancing layer formation process, an electric power of 1.5 kW to 2.5 kW may be supplied to the sputtering target. The electric power may be applied to have an intensity of 1.6 kW to 2 kW. In such a case, it is possible to help the surface roughness characteristic of the adhesion enhancing layer 212 to be controlled within a predetermined range in the embodiment.

In one or more embodiments, the adhesion enhancing layer formation process may be performed after 15 or more seconds from a time when a thin film is completely formed to be disposed in contact with the lower surface of the adhesion enhancing layer (for example, the lower light shielding layer). The adhesion enhancing layer formation process may be performed after 15 or more seconds from a time when a thin film is completely formed to be disposed in contact with the lower surface of the adhesion enhancing layer. The adhesion enhancing layer formation process may be performed within 30 seconds from the time when a thin film is completely formed to be disposed in contact with the lower surface of the adhesion enhancing layer.

In one or more embodiments, the adhesion enhancing layer formation process may be performed after the atmospheric gas applied to the formation of a thin film (for example, the lower light shielding layer) disposed in contact with the lower surface of the adhesion enhancing layer is completely exhausted from the sputtering chamber. The adhesion enhancing layer formation process may be performed within 10 seconds from the time when the atmospheric gas applied to the formation of a thin film disposed in contact with the lower surface of the adhesion enhancing layer is completely exhausted. The adhesion enhancing layer formation process may be performed within 5 seconds from the time when the atmospheric gas applied to the formation of a thin film disposed in contact with the lower surface of the adhesion enhancing layer is completely exhausted.

In such a case, the composition of the adhesion enhancing layer can be further elaborately controlled.

In the adhesion enhancing layer formation process, the ratio of the flow rate of the reactive gas to the flow rate of the inert gas included in the atmospheric gas may be a value of 0.2 to 0.8. The ratio of the flow rate may be a value of 0.3 to 0.7. The ratio of the flow rate may be a value of 0.35 to 0.6.

The ratio of the oxygen amount to the nitrogen amount included in the reactive gas may be 0.2 or less. The ratio may be 0.1 or less. The ratio may be 0.001 or more.

In such a case, the difference in the surface energy between the lower light shielding layer and the adhesion enhancing layer can be decreased further.

The formation of the adhesion enhancing layer may proceed for a time of 1 second to 15 seconds. The formation of the adhesion enhancing layer may proceed for a time of 2 seconds to 8 seconds.

In such a case, the thickness and the surface roughness characteristic of the adhesion enhancing layer can be controlled within a range predetermined in the embodiment.

The description of the surface roughness characteristic of the adhesion enhancing layer immediately after forming is similar to the above description and thus omitted.

In one or more embodiments, the second light shielding film may be formed on the adhesion enhancing layer. The second light shielding film may be formed in contact with the upper surface of the adhesion enhancing layer. The second light shielding film may be formed in contact with the surface of another thin film disposed on the adhesion enhancing layer.

In the second light shielding film formation operation, an electric power of 1 to 2 kW may be supplied to the sputtering target. The electric power may be applied to be intensity of 1.2 to 1.7 kW. In such a case, it is possible to help the second light shielding film to have desired optical properties and etching characteristics.

In one or more embodiments, the second light shielding film formation operation may be performed after 15 seconds or more from the time when a thin film (for example, the adhesion enhancing layer) is formed to be disposed in contact with the lower surface of the second light shielding film. The second light shielding film formation operation may be performed after 20 seconds or more from the time when a thin film is formed to be disposed in contact with the lower surface of the second light shielding film. The second light shielding film formation operation may be performed within 30 seconds from the time when a thin film is formed to be disposed in contact with the lower surface of the second light shielding film.

In one or more embodiments, the second light shielding film formation operation may be performed after the atmospheric gas applied to the formation of a thin film (for example, the adhesion enhancing layer) disposed in contact with the lower surface of the second light shielding film is completely exhausted from the sputtering chamber. The second light shielding film formation operation may be performed within 10 seconds from the time when the atmospheric gas applied to the formation of a thin film disposed in contact with the lower surface of the second light shielding film. The second light shielding film formation operation may be performed within 5 seconds from the time when the atmospheric gas applied to the formation of a thin film disposed in contact with the lower surface of the second light shielding film is completely exhausted.

In such a case, the composition of the second light shielding film can be further elaborately controlled.

In the second light shielding film formation operation, the ratio of the flow rate of the reactive gas to the flow rate of the inert gas included in the atmospheric gas may be a value of 0.3 to 0.7. The ratio of the flow rate may be a value of 0.4 to 0.6.

In the second light shielding film formation operation, the ratio of the oxygen amount to the nitrogen amount included in the reactive gas may be 0.3 or less. The ratio may be 0.1 or less. The ratio may be 0.001 or more.

In such a case, the shape of the multilayer light shielding pattern film formed by pattering of the multilayer light shielding film can be further elaborately controlled.

The formation of the second light shielding film may proceed for a time of 10 seconds to 30 seconds. The formation of the second light shielding film may proceed for a time of 15 seconds to 25 seconds. In such a case, when the multilayer light shielding pattern film is formed through dry etching, the shape of the multilayer light shielding pattern film can be further elaborately controlled.

Manufacturing Method of Semiconductor Element

A manufacturing method of a semiconductor element according to one or more embodiments of the present application may include a preparation of disposing a light source, a photomask, and a semiconductor wafer in which a resist film have been applied, an exposure operation of selectively transmitting a light incident from the light source on the semiconductor wafer through the photomask to be transferred and a development operation of developing a pattern on the semiconductor wafer.

The photomask may include a transparent substrate.

The transparent substrate may include a light shielding area.

The photomask includes a multilayer light shielding pattern film disposed on the light shielding area.

The multilayer light shielding pattern film may include a first light shielding film and a second light shielding film which is disposed on the first light shielding film and includes a transition metal and at least any one between oxygen and nitrogen.

The multilayer light shielding pattern film may include a first light shielding film and a second light shielding film disposed on the first light shielding film.

The multilayer light shielding pattern film has a pEA (for photomask, Edge side Area damaged) value of 2 nm$^2$ or less according to Equation 2 below.

$$pEA = \frac{pBC - pAC}{2N} \quad \text{[Equation 2]}$$

In the Equation 2, the pBC value is a sectional area of the multilayer light shielding pattern measured before cleaning is performed.

The pAC value is a sectional area of the multilayer light shielding pattern film measured after the photomask is soaked for 800 seconds in SC-1 solution and rinsed by ozone water.

The N value is the number of light shielding areas observed in the section of the photomask.

The SC-1 solution is a solution including $NH_4OH$ of 14.3% by weight, $H_2O_2$ of 14.3% by weight, and $H_2O$ of 71.4% by weight.

The ozone water is a solution including an ozone concentration of 20 ppm (based on the weight) with ultrapure water as a solvent.

In the preparation, the light source is apparatus which can generate an exposure light with a short wavelength. The exposure light may be a light with a wavelength of 200 nm or less. The exposure light may be ArF light with a wavelength of 193 nm.

A lens may be additionally disposed between the photomask and the semiconductor wafer. The lens has a function of miniaturing the shape of a circuit pattern on the photomask and transferring the pattern on the semiconductor wafer. The lens may be an ordinary one applicable to an ArF exposure process of a semiconductor wafer and it is not limited in the type. For example, the lens may be a lens composed of calcium fluoride ($CaF_2$).

In the exposure operation, an exposure light may be selectively transmitted on the semiconductor wafer through the photomask. In such a case, chemical modification may occur in a portion to which an exposure light has been incident within a resist film.

In the development operation, the semiconductor wafer after the exposure operation is treated with a developing solution and thereby a pattern may be developed on the semiconductor wafer. When the applied resist film is a positive resist, a portion to which an exposure light has been incident within a resist film may be dissolved by a developing solution. When the applied resist film is a negative resist, a portion to which an exposure light is not incident may be dissolved by a developing solution. By the treatment with a developing solution, the resist film is formed into a resist pattern. By taking the resist pattern as a mask a pattern may be formed on the semiconductor wafer.

The description of the photomask is similar with the description as discussed above and thus omitted.

Manufacture Example: Formation of Multilayer Light Shielding Film

Example 1: A transparent substrate made from quartz in the size of 6 inched width, 6 inched length, and 0.25 inched thickness was disposed in a chamber of DC sputtering apparatus. A chrome target was disposed in the chamber to have the T/S distance of 255 mm and the angle of 25 degrees between the substrate and the target.

Thereafter, on the transparent substrate, a first light shielding film including a lower light shielding layer and an adhesion enhancing layer disposed on the lower light shielding layer was formed on the transparent substrate. In detail, the atmospheric gas mixed in the volume ratio of $Ar:N_2:CO_2=3:2:5$ was introduced in a chamber, electric power of 1.85 kW was supplied to a sputtering target, a rotation speed of 30 RPM for the substrate was applied, and thereby a sputtering process proceeded for a time of 200 seconds to 250 seconds to form a lower light shielding layer.

After the formation of a lower light shielding layer, the atmospheric gas mixed in the volume ratio of $Ar:N_2:CO_2=3:2:5$ was introduced in a chamber, electric power of 1.85 kW was supplied to a sputtering target, a rotation speed of 30 RPM for the substrate was applied, and thereby a sputtering process proceeded for 2 seconds to form an adhesion enhancing layer on the lower light shielding layer. After 20 seconds from the time when the formation of the lower light shielding layer had been completed, an electric power was supplied to a sputtering target, and an atmospheric gas was injected within 5 seconds from the time when the atmospheric gas applied to the formation of the lower light shielding layer had been exhausted from the chamber completely.

After the formation of the adhesion enhancing layer, the atmospheric gas mixed in the volume ratio of $Ar:N_2=6.5:3.5$ was introduced in a chamber, electric power of 1.5 kW was supplied to a sputtering target, a rotation speed of 30 RPM for the substrate was applied, and thereby a sputtering process proceeded for a time of 10 seconds to 30 seconds on the upper surface of the adhesion enhancing layer to form a second light shielding layer.

Example 2: A multilayer light shielding film was formed under the same condition as Example 1. However, in the adhesion enhancing layer formation process, the atmospheric gas mixed in the volume ratio of $Ar:N_2:CO_2=3:1:6$ was introduced in the chamber, and the electric power of 1.83 kW was supplied to the sputtering target.

Example 3: A multilayer light shielding film was formed under the same condition as Example 1. However, in the adhesion enhancing layer formation process, the atmospheric gas mixed in the volume ratio of $Ar:N_2:$ $CO_2=4:1:5$ was introduced in the chamber, and the electric power of 1.5 kW was supplied to the sputtering target.

Example 4: A multilayer light shielding film was formed under the same condition as Example 1. However, in the adhesion enhancing layer formation process, the rotation speed of 20 RPM for the substrate was applied.

Comparative Example 1: A multilayer light shielding film was formed under the same condition as Example 1. However, in the adhesion enhancing layer formation process, the atmospheric gas mixed in the volume ratio of $Ar:N_2=3:7$ was introduced in the chamber, and the electric power of 2 kW was supplied to the sputtering target.

Comparative Example 2: A multilayer light shielding film was formed under the same condition as Example 1. However, in the adhesion enhancing layer formation process, the atmospheric gas mixed in the volume ratio of $Ar:N_2=3:7$ was introduced in the chamber, the rotation speed of 10 RPM for the substrate was applied, the time of 5 seconds for forming the adhesion enhancing layer was applied, and the electric power of 1.5 kW was supplied to the sputtering target.

Comparative Example 3: A multilayer light shielding film was formed under the same condition as Example 1. However, in the adhesion enhancing layer formation process, the atmospheric gas mixed in the volume ratio of $Ar:N_2=3:7$ was introduced in the chamber, the time of 10 seconds for forming the adhesion enhancing layer was applied, and the rotation speed of 5 RPM for the substrate was applied.

Comparative Example 4: A multilayer light shielding film was formed under the same condition as Example 1. However, the adhesion enhancing layer was not formed between the lower light shielding layer and the second light shielding film.

Comparative Example 5: A multilayer light shielding film was formed under the same condition as Example 1. However, in the adhesion enhancing layer formation process, the atmospheric gas mixed in the volume ratio of $Ar:N_2:O_2=5:4:1$ was introduced in the chamber.

The condition of forming layers of each Example or Comparative Example was described in Table 1 below.

Evaluation Example: Measurement of EA Value

EA values of samples of Examples and Comparative Examples were measured. In detail, a sample of each Example or Comparative Example was cut into the size of 15 mm vertically and horizontally. Thereafter, the upper surface of the processed sample was treated by FIB (Focused Ion Beam), and after that, TEM image of a section of the sample was measured by JEM-2100F HR model available from JEOL LTD. BC values of Examples and Comparative Examples were calculated from TEM images obtained in this manner.

Thereafter, the processed sample was soaked for 800 seconds in SC-1 solution and enhanced cleaning thereof was performed. The amounts of $NH_4OH$ of 14.3% by weight, $H_2O_2$ of 14.3% by weight, and $H_2O$ of 71.4% by weight were applied to the SC-1 solution. Thereafter, the processed blank mask was taken out from the solution and SC-1 solution remaining on the processed blank mask was removed by using of ozone water. The ozone water was a solution including an ozone concentration of 20 ppm (based on the weight) with ultrapure water as a solvent. Digesting by SC-1 solution and rinsing by ozone water were performed at a room temperature.

Thereafter, AC value was measured in the same method as the method of measuring BC value. Besides, an EA value of the blank mask was calculated from the measured BC value and AC value.

The result of measurement of each Example or Comparative Example was described in Table 2 below.

Evaluation Example: Thickness Measurement of Each Thin Film

TEM image of a sample of each Example or Comparative Example was measured and the thicknesses of the lower light shielding layer, the adhesion enhancing layer, and the second light shielding film. The method of measuring TEM image was applied by the same method as the method applied when the above EA value is measured.

The result of measurement of each Example or Comparative Example was described in Table 2 below.

Evaluation Example: Measurement of Optical Properties

Optical density and transmittance with respect to a light with the wavelength of 193 nm of a sample of each Example of Comparative Example was measured by using of a spectroscopic ellipsometer of MG-Pro model available from Nano-View Co., Ltd.

The result of measurement of each Example or Comparative Example was described in Table 2 below.

Evaluation Example: Measurement of Surface Roughness Immediately after Forming

In the process of manufacturing samples of Examples 1 to 4 and Comparative Examples 1 to 3 and Comparative Example 5, immediately after the formation of the adhesion enhancing layer, the Rsk (skewness) value, Rku (kurtosis) value, Rq (root mean square deviation roughness) value, Ra (arithmetic mean deviation roughness) value, Rz (10-point average roughness) value, and Rpv (sum of the maximum peak height and the maximum valley depth) value were measured. In detail, the measurement was performed in the area of 1 μm vertically and horizontally, placed in the center of the surface of the adhesion enhancing layer. By using of a roughness meter, Rsk values and the like were measured in the area with the scan speed set to be 0.5 Hz in No-contact mode. The roughness meter was applied by XE-150 model available from Park Systems applied with PPP-NCHR which is Cantilever model available from Park Systems.

The result of measurement of each Example or Comparative Example was described in Table 3 below.

Evaluation Example: Measurement of Composition by Thin Films

The amounts by elements of each layer or each film were measured by use of an XPS analysis. In detail, a blank mask of each Example or Comparative Example was cut into the size of 15 mm vertically and horizontally and a sample was prepared. The sample was disposed in a measuring apparatus of K-Alpha model available from Thermo Scientific, and after that, the area of 2 mm vertically and 4 mm horizontally placed in the center of the sample was etched and the amounts by elements of each layer or each film were measured. The result of measurement of each Example or Comparative Example was described in Table 4 below.

TABLE 1

| | Type of Thin Film | Electric Power for Sputtering (kW) | Rotation Speed for Substrate (RPM) | Time for Forming Layers (Sec) | Composition of Atmospheric Gas (Volume Ratio) |
|---|---|---|---|---|---|
| Example 1 | Second Light shielding film | 1.5 | 30 | 10~30 | Ar:N$_2$ = 6.5:3.5 |
| | Adhesion Enhancing Layer | 1.85 | 30 | 2 | Ar:N$_2$:CO$_2$ = 3:2:5 |
| | Lower light shielding layer | 1.85 | 30 | 200~250 | Ar:N$_2$:CO$_2$ = 3:2:5 |
| Example 2 | Second Light shielding film | 1.5 | 30 | 10~30 | Ar:N$_2$ = 6.5:3.5 |
| | Adhesion Enhancing Layer | 1.83 | 30 | 2 | Ar:N$_2$:CO$_2$ = 3:1:6 |
| | Lower light shielding layer | 1.85 | 30 | 200~250 | Ar:N$_2$:CO$_2$ = 3:2:5 |
| Example 3 | Second Light shielding film | 1.5 | 30 | 10~30 | Ar:N$_2$ = 6.5:3.5 |
| | Adhesion Enhancing Layer | 1.50 | 30 | 5 | Ar:N$_2$:CO$_2$ = 4:1:5 |
| | Lower light shielding layer | 1.85 | 30 | 200~250 | Ar:N$_2$:CO$_2$ = 3:2:5 |
| Example 4 | Second Light shielding film | 1.5 | 30 | 10~30 | Ar:N$_2$ = 6.5:3.5 |
| | Adhesion Enhancing Layer | 1.85 | 20 | 2 | Ar:N$_2$:CO$_2$ = 3:2:5 |
| | Lower light shielding layer | 1.85 | 30 | 200~250 | Ar:N$_2$:CO$_2$ = 3:2:5 |
| Comparative Example 1 | Second Light shielding film | 1.5 | 30 | 10~30 | Ar:N$_2$ = 6.5:3.5 |
| | Adhesion Enhancing Layer | 2 | 30 | 2 | Ar:N$_2$ = 3:7 |
| | Lower light shielding layer | 1.85 | 30 | 200~250 | Ar:N$_2$:CO$_2$ = 3:2:5 |

TABLE 1-continued

| | Type of Thin Film | Electric Power for Sputtering (kW) | Rotation Speed for Substrate (RPM) | Time for Forming Layers (Sec) | Composition of Atmospheric Gas (Volume Ratio) |
|---|---|---|---|---|---|
| Comparative Example 2 | Second Light shielding film | 1.5 | 30 | 10~30 | $Ar:N_2 = 6.5:3.5$ |
| | Adhesion Enhancing Layer | 1.5 | 10 | 5 | $Ar:N_2 = 3:7$ |
| | Lower light shielding layer | 1.85 | 30 | 200~250 | $Ar:N_2:CO_2 = 3:2:5$ |
| Comparative Example 3 | Second Light shielding film | 1.5 | 30 | 10~30 | $Ar:N_2 = 6.5:3.5$ |
| | Adhesion Enhancing Layer | 1.85 | 5 | 10 | $Ar:N_2 = 3:7$ |
| | Lower light shielding layer | 1.85 | 30 | 200~250 | $Ar:N_2:CO_2 = 3:2:5$ |
| Comparative Example 4 | Second Light shielding film | 1.5 | 30 | 10~30 | $Ar:N_2 = 6.5:3.5$ |
| | Lower light shielding layer | 1.85 | 30 | 200~250 | $Ar:N_2:CO_2 = 3:2:5$ |
| Comparative Example 5 | Second Light shielding film | 1.5 | 30 | 10~30 | $Ar:N_2 = 6.5:3.5$ |
| | Adhesion Enhancing Layer | 1.85 | 30 | 5 | $Ar:N_2:CO_2 = 5:4:1$ |
| | Lower light shielding layer | 1.85 | 30 | 200~250 | $Ar:N_2:CO_2 = 3:2:5$ |

TABLE 2

| | | Thickness (A) | Transmittance (%) | Optical Density | EA Value (mm²) |
|---|---|---|---|---|---|
| Example 1 | Second Light shielding film | 60 | 1.85 | 1.43 | 0.50 |
| | Adhesion Enhancing Layer | 3.5 | | | |
| | Lower light shielding layer | 460 | | | |
| Example 2 | Second Light shielding film | 60 | 1.84 | 1.45 | 0.55 |
| | Adhesion Enhancing Layer | 3.5 | | | |
| | Lower light shielding layer | 460 | | | |
| Example 3 | Second Light shielding film | 60 | 1.80 | 1.51 | 1.30 |
| | Adhesion Enhancing Layer | 7.5 | | | |
| | Lower light shielding layer | 460 | | | |
| Example 4 | Second Light shielding film | 60 | 1.83 | 1.45 | 0.85 |
| | Adhesion Enhancing Layer | 3.5 | | | |
| | Lower light shielding layer | 460 | | | |
| Comparative Example 1 | Second Light shielding film | 60 | 1.71 | 1.63 | 2.80 |
| | Adhesion Enhancing Layer | 5.0 | | | |
| | Lower light shielding layer | 460 | | | |

TABLE 2-continued

| | | Thickness (A) | Transmittance (%) | Optical Density | EA Value (mm²) |
|---|---|---|---|---|---|
| Comparative Example 2 | Second Light shielding film | 60 | 1.25 | 1.98 | 3.10 |
| | Adhesion Enhancing Layer | 9.0 | | | |
| | Lower light shielding layer | 460 | | | |
| Comparative Example 3 | Second Light shielding film | 60 | 1.03 | 2.17 | 2.75 |
| | Adhesion Enhancing Layer | 20 | | | |
| | Lower light shielding layer | 460 | | | |
| Comparative Example 4 | Second Light shielding film | 60 | 1.43 | 1.85 | 3.00 |
| | Lower light shielding layer | 460 | | | |
| Comparative Example 5 | Second Light shielding film | 60 | 1.52 | 1.75 | 3.10 |
| | Adhesion Enhancing Layer | 17 | | | |
| | Lower light shielding layer | 460 | | | |

TABLE 3

| | Surface Roughness of Adhesion Enhancing Layer | | | | | |
|---|---|---|---|---|---|---|
| | Rpv (nm) | Rq (nm) | Ra (nm) | Rz (nm) | Rsk | Rku |
| Example 1 | 8.502 | 1.090 | 0.722 | 8.283 | −1.926 | 7.244 |
| Example 2 | 8.609 | 0.874 | 0.547 | 8.157 | −2.484 | 11.964 |
| Example 3 | 7.372 | 0.823 | 0.556 | 7.167 | −1.946 | 8.573 |
| Example 4 | 8.391 | 1.001 | 0.640 | 8.570 | −1.353 | 11.432 |
| Comparative Example 1 | 5.429 | 0.419 | 0.309 | 4.939 | −1.006 | 5.309 |

TABLE 3-continued

| | Surface Roughness of Adhesion Enhancing Layer | | | | | |
| --- | --- | --- | --- | --- | --- | --- |
| | Rpv (nm) | Rq (nm) | Ra (nm) | Rz (nm) | Rsk | Rku |
| Comparative Example 2 | 5.570 | 0.529 | 0.394 | 5.240 | −0.394 | 4.864 |
| Comparative Example 3 | 5.601 | 0.498 | 0.368 | 5.294 | −0.821 | 5.436 |
| Comparative Example 4 | — | — | — | — | — | — |
| Comparative Example 5 | 8.921 | 1.299 | 1.094 | 8.475 | −0.523 | 2.579 |

TABLE 4

| | Type of Layer/Film | Amount of Element (at %) | | | |
| --- | --- | --- | --- | --- | --- |
| | | Cr | O | C | N |
| Example 1 | Second Light shielding film | 67 | 10 | 3 | 20 |
| | Adhesion Enhancing Layer | 43 | 38 | 9 | 10 |
| | Lower light shielding layer | 43 | 38 | 9 | 10 |
| Example 2 | Second Light shielding film | 67 | 10 | 3 | 20 |
| | Adhesion Enhancing Layer | 43 | 38 | 9 | 10 |
| | Lower light shielding layer | 43 | 38 | 9 | 10 |
| Example 3 | Second Light shielding film | 67 | 10 | 3 | 20 |
| | Adhesion Enhancing Layer | 43 | 38 | 9 | 10 |
| | Lower light shielding layer | 43 | 38 | 9 | 10 |
| Example 4 | Second Light shielding film | 67 | 10 | 3 | 20 |
| | Adhesion Enhancing Layer | 43 | 38 | 9 | 10 |
| | Lower light shielding layer | 43 | 38 | 9 | 10 |
| Comparative Example 1 | Second Light shielding film | 67 | 10 | 3 | 20 |
| | Adhesion Enhancing Layer | 49 | 6 | 1 | 44 |
| | Lower light shielding layer | 43 | 38 | 9 | 10 |
| Comparative Example 2 | Second Light shielding film | 67 | 10 | 3 | 20 |
| | Adhesion Enhancing Layer | 48 | 6 | 1 | 45 |
| | Lower light shielding layer | 43 | 38 | 9 | 10 |
| Comparative Example 3 | Second Light shielding film | 67 | 10 | 3 | 20 |
| | Adhesion Enhancing Layer | 38 | 10 | 3 | 49 |
| | Lower light shielding layer | 43 | 38 | 9 | 10 |
| Comparative Example 4 | Second Light shielding film | 67 | 10 | 3 | 20 |
| | Lower light shielding layer | 43 | 38 | 9 | 10 |
| Comparative Example 5 | Second Light shielding film | 67 | 10 | 3 | 20 |
| | Adhesion Enhancing Layer | 52 | 20 | 5 | 23 |
| | Lower light shielding layer | 43 | 38 | 9 | 10 |

In the Table 2, EA values of Examples 1 to 4 were measured to have a value of 2 mm$^2$ or less, on the other hand, EA values of Comparative Examples 1 to 5 were measured to have a value of more than 2 mm$^2$.

In the Table 3, the Rsk (skewness) values of Examples 1 to 4 showed a value of −3 to −1.1, on the other hand, the Rsk (skewness) values of Comparative Examples 1 to 3 and Comparative Example 5 showed a value more than −1.1.

The Rku (kurtosis) values of Examples 1 to 4 showed a value of 5.5 or more, on the other hand, the Rku (kurtosis) values of Comparative Examples 1 to 3 and Comparative Example 5 showed a value less than 5.5.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A blank mask, comprising a transparent substrate and a multilayer light shielding film disposed on the transparent substrate, wherein the multilayer light shielding film comprises a transition metal and at least any one between oxygen and nitrogen, wherein the multilayer light shielding film comprises a first light shielding film and a second light shielding film, disposed on the first light shielding film and having a different composition than the first light shielding film, wherein the first light shielding film comprises a lower light shielding layer and an adhesion enhancing layer on the lower light shielding layer, the adhesion enhancing layer including the transition metal in an amount of 30-60 at %, carbon in an amount of 7-20 at %, nitrogen in an amount of 7-20 at %, wherein the sum of oxygen and nitrogen in the adhesion enhancing layer is 25-80 at %, and wherein the adhesion enhancing layer has a thickness of 1 Å to 15 Å, wherein the adhesion enhancing layer has a transition metal content different from that of the lower light shielding layer and the second light-shielding film, and wherein the multilayer light shielding film has an EA (Edge side Area damaged) value of 2 nm$^2$ or less according to Equation 1 below;

$$EA = \frac{BC - AC}{2} \qquad \text{[Equation 1]}$$

wherein, in the Equation 1, the BC value is a sectional area of the multilayer light shielding film measured before cleaning is performed, wherein the AC value is a sectional area of the multilayer light shielding film measured after the blank mask is soaked in SC-1 (Standard Cleaning-1) solution for 800 seconds and rinsed by ozone water, wherein the SC-1 solution is a solution comprising NH$_4$OH of 14.3% by weight, H$_2$O$_2$ of 14.3% by weight, and H$_2$O of 71.4% by weight, and wherein the ozone water is a solution comprising an ozone concentration of 20 ppm (based on the weight) with ultrapure water as a solvent.

2. The blank mask of claim 1, wherein a value of subtracting an amount of the transition metal of the adhesion enhancing layer from an amount of the transition metal of the lower light shielding layer has an absolute value of 10% or less.

3. The blank mask of claim 1, wherein a value of subtracting an amount of the transition metal of the adhesion enhancing layer from an amount of the transition metal of the second light shielding film has an absolute value of 35% or less.

4. The blank mask of claim 1, wherein a value of subtracting an amount value of oxygen of the adhesion enhancing layer from an amount value of oxygen of the lower light shielding layer has an absolute value of 10% or less, and wherein a value of subtracting an amount value of nitrogen of the adhesion enhancing layer from an amount value of nitrogen of the lower light shielding layer has an absolute value of 10% or less.

5. The blank mask of claim 1, wherein a value of subtracting an amount of oxygen of the adhesion enhancing layer from an amount of oxygen from the amount value of oxygen of the second light shielding film has an absolute value of 35% or less, and wherein a value of subtracting an amount of nitrogen of the adhesion enhancing layer from an amount of nitrogen of the second light shielding film has an absolute value of 25% or less.

6. The blank mask of claim 1, wherein an upper surface of the adhesion enhancing layer immediately after forming has an Rsk (skewness) value of −3 to −1.1, and an Rsk (kurtosis) value of 5.5 or more.

7. The blank mask of claim 1, wherein an upper surface of the adhesion enhancing layer immediately after forming has an Ra (arithmetic mean deviation roughness) of 0.4 nm to 3 nm.

8. The blank mask of claim 1, wherein a value of subtracting an amount of the transition metal of the lower light shielding layer from an amount of the transition metal of the second light shielding film has an absolute value of 5% to 35%.

9. The blank mask of claim 1, wherein the transition metal comprises at least any one among Cr, Ta, Ti and Hf.

10. A photomask, comprising:

a transparent substrate, wherein the transparent substrate comprises a light shielding area; and a multilayer light shielding pattern film disposed on the light shielding area, wherein the multilayer light shielding pattern film comprises a transition metal and at least any one between oxygen and nitrogen, wherein the multilayer light shielding pattern film comprises a first light shielding film and a second light shielding film, disposed on the first light shielding film and having a different composition than the first light shielding film, wherein the first light shielding film comprises a lower light shielding layer and an adhesion enhancing layer on the lower light shielding layer, the adhesion enhancing layer including the transition metal in an amount of 30-60 at %, carbon in an amount of 7-20 at %, nitrogen in an amount of 7-20 at %, wherein the sum of oxygen and nitrogen in the adhesion enhancing layer is 25-80 at %, and wherein the adhesion enhancing layer has a thickness of 1 Å to 15 Å, wherein the adhesion enhancing layer has a transition metal content different from that of the lower light shielding layer and the second light-shielding film, and wherein the multilayer light shielding pattern film has a pEA (for photomask, Edge side Area damaged) value of 2 nm$^2$ or less according to Equation 2 below;

$$pEA = \frac{pBC - pAC}{2N} \qquad \text{[Equation 2]}$$

wherein, in the Equation 2, the pBC value is a sectional area of the multilayer light shielding pattern film before cleaning is performed, wherein the pAC value is a sectional area of the multilayer light shielding pattern film measured after the photomask is soaked in SC-1 (Standard Cleaning-1) solution for 800 seconds and rinsed by ozone water, wherein the N value is the number of light shielding areas observed in the section of the photomask, wherein the SC-1 solution is a solution comprising NH$_4$OH of 14.3% by weight, H$_2$O$_2$ of 14.3% by weight, and H$_2$O of 71.4% by weight, and wherein the ozone water is a solution comprising an ozone concentration of 20 ppm (based on the weight) with ultrapure water as a solvent.

11. A manufacturing method of a semiconductor element, the method comprising:

a preparation of disposing a light source, a photomask, and a semiconductor wafer where a resist film have been applied;

an exposure operation of selectively transmitting a light incident from the light source to the semiconductor wafer through the photomask to be transferred; and a development operation of developing a pattern on the semiconductor wafer, wherein the photomask comprises a transparent substrate, wherein the transparent substrate comprises a light shielding area, wherein the photomask comprises a multilayer light shielding pattern film disposed on the light shielding area, wherein the multilayer light shielding pattern film comprises a transition metal and at least any one between oxygen and nitrogen, wherein the multilayer light shielding pattern film comprises a first light shielding film and a second light shielding film, disposed on the first light shielding film and having a different composition than the first light shielding film, wherein the first light shielding film comprises a lower light shielding layer and an adhesion enhancing layer on the lower light shielding layer, the adhesion enhancing layer including the transition metal in an amount of 30-60 at %, carbon in an amount of 7-20 at %, nitrogen in an amount of 7-20 at %, wherein the sum of oxygen and nitrogen in the adhesion enhancing layer is 25-80 at %, and wherein the adhesion enhancing layer has a thickness of 1 Å to 15 Å, wherein the adhesion enhancing layer has a transition metal content different from that of the lower light shielding layer and the second light-shielding film, and wherein the multilayer light shielding pattern film has a pEA (for photomask, Edge side Area damaged) value of 2 nm$^2$ or less according to Equation 2 below;

$$pEA = \frac{pBC - pAC}{2N} \qquad \text{[Equation 2]}$$

wherein, in the Equation 2, the pBC value is a sectional area of the multilayer light shielding pattern film measured before cleaning is performed, wherein the pAC value is a sectional area of the multilayer light shielding pattern film measured after the photomask is soaked in SC-1 (Standard Cleaning-1) solution for 800 seconds and rinsed by ozone water, wherein the N value is the number of light shielding areas observed in the section of the photomask, wherein the SC-1 solution is a solution comprising $NH_4OH$ of 14.3% by weight, $H_2O_2$ of 14.3% by weight, and $H_2O$ of 71.4% by weight, and wherein the ozone water is a solution comprising an ozone concentration of 20 ppm (based on the weight) with ultrapure water as a solvent.

\* \* \* \* \*